United States Patent
Park et al.

(10) Patent No.: US 8,481,161 B2
(45) Date of Patent: Jul. 9, 2013

(54) FUNCTIONALIZED METAL NANOPARTICLE AND METHOD FOR FORMATION OF CONDUCTIVE PATTERN USING THE SAME

(75) Inventors: Jong Jin Park, Yongin-si (KR); Sung Woong Kim, Suwon-si (KR); Dong Woo Shin, Seoul (KR); Sang Hoon Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1532 days.

(21) Appl. No.: 11/589,783

(22) Filed: Oct. 31, 2006

(65) Prior Publication Data

US 2008/0003363 A1   Jan. 3, 2008

(30) Foreign Application Priority Data

Jun. 28, 2006 (KR) .................. 10-2006-0058846
Aug. 9, 2006 (KR) .................. 10-2006-0075148

(51) Int. Cl.
*B32B 5/16* (2006.01)
*B32B 33/00* (2006.01)
*G03C 1/52* (2006.01)
*G03C 1/73* (2006.01)

(52) U.S. Cl.
USPC ........... 428/403; 428/323; 428/328; 430/138; 430/269; 430/330

(58) Field of Classification Search
CPC .... B32B 5/16; B32B 3/003; G03C 1/52; G03C 1/73
USPC ................ 428/403, 323, 328; 430/138, 269, 430/330
See application file for complete search history.

(56) References Cited

U.S. PATENT DOCUMENTS

| | | | | |
|---|---|---|---|---|
| 7,115,688 | B1 * | 10/2006 | Mirkin et al. | 526/127 |
| 7,166,412 | B2 * | 1/2007 | Park et al. | 430/270.1 |
| 7,473,513 | B1 * | 1/2009 | Park et al. | 430/281.1 |
| 7,687,145 | B2 * | 3/2010 | Frechet et al. | 428/403 |
| 7,923,110 | B2 * | 4/2011 | Park et al. | 428/403 |
| 2004/0253536 | A1 * | 12/2004 | Park et al. | 430/270.1 |

(Continued)

FOREIGN PATENT DOCUMENTS

KR   10-2004-0106604 A   12/2004
WO   WO 2004/012855 A2 *  2/2004

OTHER PUBLICATIONS

Flink et al., Self-assembled Monolayers on Gold for Applications in Chemical Sensing, University of Twente, Enschede, The Netherlands, 2002.*

(Continued)

*Primary Examiner* — Hoa (Holly) Le
(74) *Attorney, Agent, or Firm* — Harness, Dickey & Pierce

(57) ABSTRACT

A printable metal nanoparticle having a self-assembled monolayer (SAM) composed of a compound containing a thiol (—SH), isocyanide (—CN), amino (—NH$_2$), carboxylate (—COO) or phosphate group, as a linker, formed on the surface thereof, and a method for formation of a conductive pattern using the same are provided. The metal nanoparticles of an exemplary embodiment can be easily formed into a conductive film or pattern by a printing method, and the resulting film or pattern exhibits excellent conductivity which optimally may be adjusted if desired. Therefore, the resulting metal nanoparticles of can be used to advantage in the fields such as antistatic washable sticky mats, antistatic shoes, conductive polyurethane printer rollers, electromagnetic interference shielding materials, etc.

17 Claims, 1 Drawing Sheet

U.S. PATENT DOCUMENTS

| | | | |
|---|---|---|---|
| 2005/0074551 A1* | 4/2005 | Huang et al. | 427/212 |
| 2006/0145146 A1* | 7/2006 | Suh et al. | 257/40 |
| 2008/0020317 A1* | 1/2008 | Park et al. | 430/138 |
| 2008/0299382 A1* | 12/2008 | Moon et al. | 428/323 |

OTHER PUBLICATIONS

Takafuji et al, Preparation of Poly(1-vinylimidazole)-Grafted Magnetic Nanoparticles and Their Applicatioin for Removal of Metal Ions, Chem. Mater, 2004, 16, 1977-1983.*

Bharathi and Lev, Direct systhesis of gold nanodispersions in sol-gel derived silicate sols, gels and films, Chem. Comm., 1997, 2303-2304.*

Nakao et al., Highly ordered Assemblies of Au nanoparticles organized on DNA, Nano Lett., vol. 3, No. 10 (2003) 1391-1394.*

Subramaniam et al., On the formation of protected gold nanoparticles from AuCl4 by the reduction using aromatic amines (J. of Nanoparticle Research (2005) 7: 209:217.*

Schön, G., et al., "*A fascinating new field in colloid science: small ligand-stabilized metal clusters and possible application in microelectronics Part 1: State of the art*", Colloid Polym. Sci., 1995, pp. 101-117, vol. 273, Steinkopff-Verlag, Germany.

Goldstein, A.N., et al., "*Melting in Semiconductor Nanocrystals*", Reports: Science, Jun. 5, 1992, pp. 1425-1427, vol. 256, Amer. Assn. for the Advancement of Science, Washington, D.C., US.

Tao, Yu-Tai, "*Structural Comparison of Self-Assembled Monolayers of n-Alkanoic Acids on the Surfaces of Silver, Copper, and Aluminum*", J. Am. Chem. Soc., 1993, pp. 4350-4358, vol. 115, No. 10, American Chemical Society, Easton, PA, US.

Laibinis, Paul E., et al., "*Comparison of the Structures and Wetting Properties of Self-Assembled Monolayers of n-Alkanethiols on the Coinage Metal Surfaces, Cu, Ag, Au*", J. Am. Chem. Soc., 1991, pp. 7152-7167, vol. 113, No. 19, American Chemical Society, Easton, PA, US.

* cited by examiner

FUNCTIONALIZED METAL NANOPARTICLE AND METHOD FOR FORMATION OF CONDUCTIVE PATTERN USING THE SAME

This non-provisional application claims priority under 35 U.S.C. §119(a) on Korean Patent Applications No. 2006-58846 and 2006-75148 filed on Jun. 28, 2006 and Aug. 9, 2006, respectively, which are herein incorporated by references.

BACKGROUND OF THE DISCLOSURE

1. Field of the Disclosure

Exemplary embodiments of the present invention relate to a novel metal nanoparticle and a method for forming a conductive pattern using the same. More specifically, exemplary embodiments of the present invention relates to a method for forming a conductive pattern comprising dispersing at least one of metal nanoparticles in an organic solvent and forming a pattern using a printing method wherein the metal nanoparticle has a self-assembled monolayer (SAM) composed of a compound containing a thiol, isocyanide, amino, carboxylate or phosphate group, as a linker, formed on the surface thereof.

2. Description of the Related Art

Materials having a nano-size molecular structure exhibit a variety of electrical, optical and biological properties depending upon one-, two- and three-dimensional space structures and the orders thereof. Therefore, a great deal of research and study has been actively directed to nanoparticles in various application areas including nano-scale materials, optical information electrons, development of biomaterials and the like. Among various types of nano-scale materials, particularly metal nanoparticles have potential applicability in a broad range of areas. This is because, when metals are reduced to a nano-scale size from the bulk state thereof, they will have unique catalytic, electrical, photoelectrical and magnetic properties as the surface area thereof is significantly increased as there are very few metal atoms in nanoparticles. Further, metal nanoparticles, showing conductivity through an electrical conduction mechanism such as charge (or electron) transfer, have a very large specific surface area, and therefore films or patterns containing such nanoparticles may exhibit high conductivity, even at a low content of nanoparticles. In addition, when the packing density of nanoparticles is increased by controlling the particle size thereof to within a range of approximately 3 to 15 nm, it is possible to further enhance the conductivity due to facilitated charge transfer at the metal-metal interfaces.

On the other hand, great advances in the electronic industries have led to a great deal of research and study directed to the development of high-conductivity films or patterns made of various materials. When the metal nanoparticles are employed in the preparation of such conductive films or patterns, there are advantages in that it is possible to prepare high-conductivity films or patterns without sputtering or etching processes involving high vacuum or high temperature conditions and it is also possible to prepare visible light-transparent, conductive patterns by controlling the particle size of the nanoparticles. However, placement of metal nanoparticles into the films or patterns suffers from difficulties associated with the control and arrangement of such fine particles.

As an example of methods for efficient arrangement of metal nanoparticles, methods for using a self-assembled monolayer are known in the art. The self-assembled monolayer is a molecularly arranged structure of a compound containing functional group(s) exhibiting chemical affinity for a certain metal, formed on the surface of the metal nanoparticles, and its thickness can be controlled to the nano-scale, for example, from approximately 10 to 40 nm. In this regard, the formation of the self-assembled monolayer via arrangement of n-alkanethiol on the surface of the metal and the formation of the self-assembled monolayer via arrangement of n-alkanoic acids, dialkyl disulfides and dialkyl sulfides on the surface of the metals such as gold, silver, copper and aluminum have been reported.

However, due to difficulties in controlling of spatial ordering or molecular orientation, and problems associated with instability, defects, surface ordering control and aggregation of the metal nanoparticles on the thin films, occurring when using the metal nanoparticles containing the above-identified self-assembled monolayer, it is not easy to prepare films of a large area or patterns, thereby limiting the commercial application thereof. Further, use of such metal nanoparticles suffers from limitation in the line width which can be achieved via the formation of patterns by means of common photolithography processes and difficulties in the preparation of ultra-fine patterns.

Therefore, there is an urgent need in the art for the development of a novel self-assembling nanostructure which is capable of readily forming large-area films or ultra-fine patterns by means of a simple printing process using metal nanoparticles.

SUMMARY OF THE DISCLOSURE

As a result of a variety of extensive and intensive studies and experiments to solve the problems as described above, the inventors of the present invention have discovered that, upon using metal nanoparticles having a self-assembled monolayer (SAM) composed of a compound containing a thiol, isocyanide, amino, carboxylate or phosphate group, as a linker, formed on the surface thereof, it is possible to easily arrange metal nanoparticles over a large area, and it is also possible to form conductive patterns containing metal nanoparticles by common printing processes without separate sputtering, etching or photolithography processes. Exemplary embodiments of the present invention have been produced based upon these findings.

Therefore, it is an object of the exemplary embodiments of the present invention to provide a novel metal nanoparticle which is capable of readily forming large-area films or patterns by means of a printing process and a method for forming a pattern using the same.

In accordance with an exemplary embodiment of the present invention, the above and other objects can be accomplished by the provision of a metal nanoparticle having a self-assembled monolayer (SAM) composed of a compound containing a thiol, isocyanide, amino, carboxylate or phosphate group, as a linker, formed on the surface thereof, and a metal nanoparticle composition.

The above-mentioned linker-containing compound may be an organic material in which a linker of an isocyanide, amino, carboxylate or phosphate group is connected to a monovalent or polyvalent organic group of 1 to 30 carbon atoms; or a compound in which a linker of a thiol, isocyanide, amino, carboxylate or phosphate group is connected to a group containing an alkoxy silyl group.

In accordance with another exemplary embodiment of the present invention, there is provided a composition comprising at least one of the above-mentioned metal nanoparticles, an organic solvent, and optionally at least one of conductive and non-conductive polymers.

In accordance with yet another exemplary embodiment of the present invention, there is provided a method for forming a pattern using the above composition.

BRIEF DESCRIPTION OF THE DRAWINGS

The above and other objects, features and other advantages of exemplary embodiments of the present invention will be described in the following detailed description taken in conjunction with the accompanying drawings, in which.

DESCRIPTION OF EXEMPLARY EMBODIMENTS

Various exemplary embodiments of the present invention will now be described in more fully with reference to the accompanying drawings.

A metal nanoparticle of an exemplary embodiment of the present invention has a structure of a self-assembled monolayer (SAM) on the surface of the metal nanoparticle, which is formed by a monovalent or polyvalent $C_1$-$C_{30}$ organic material containing an isocyanide, amino, carboxylate or phosphate group as a linker; or a compound having an alkoxy silyl group introduced therein while containing a functional group such as thiol, isocyanide group and the like as a linker. Such a structure is schematically shown in FIGS. 1 and 2.

Figure 1:
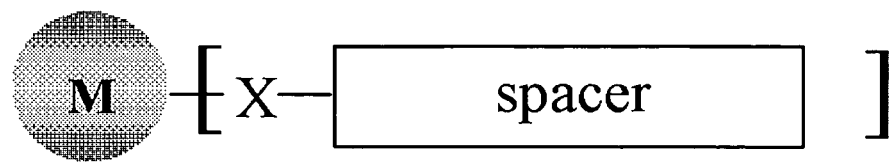
FIG. 1 is a schematic view showing a structure of a metal nanoparticle in accordance with an exemplary embodiment of the present invention.
Figure 2:
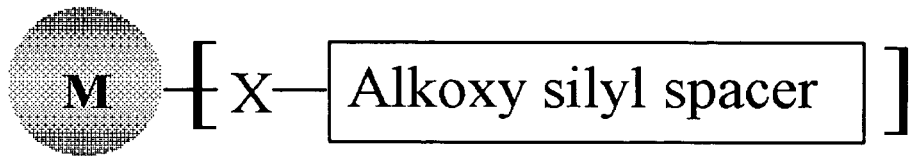
FIG. 2 is a schematic view showing a structure of a metal nanoparticle in accordance with another exemplary embodiment of the present invention.

In FIG. 1, M is a metal nanoparticle; X is NC, NH, COO, or phosphate; a spacer is a monovalent $C_1$-$C_{30}$ organic group, or a polyvalent $C_1$-$C_{30}$ organic group having at least one substituent group selected from the group consisting of OH, $NH_2$, $NO_2$, methoxy, ethoxy, phenoxy, a halogen atom, hetero sulfur, hetero amine, oxadiazole, triphenylamine, copper phthalocyanine and carbazole, preferably a monovalent or polyvalent $C_1$-$C_{30}$ organic group which is capable of containing in its carbon chain, at least one moiety selected from the group consisting of —CONH—, —COO—, —CO—, —$CH_2$—, —Si—, bis(porphyrin),

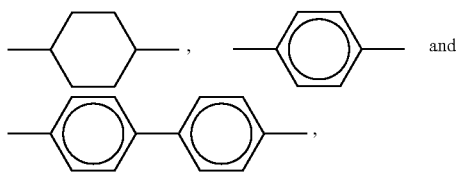

and more preferably, a mono-, di-, tri-, tetra- and penta-valent organic group.

In FIG. 2, M is a metal nanoparticle; X is S, NC, NH, COO, or phosphate; an alkoxy silyl spacer is —$(CH_2)_n$—Si(OR)$R_1R_2$ wherein $R_1$ and $R_2$ are independently $CH_3$ or OR, R is a $C_1$-$C_{20}$ alkyl group and n is an integer of from 1 to 10, preferably —$(CH_2)_n$—Si(OR)$_3$ or —$(CH_2)_n$—Si(OR)(CH$_3$)$_2$ wherein R is a $C_1$-$C_{10}$ alkyl group and n is an integer of from 1 to 6.

The metal nanoparticle of an exemplary embodiment of the present invention having a structure as shown in FIG. 1 can be prepared, for example, by formation of a self-assembled monolayer (SAM) on the surface of the metal nanoparticle, via an organic material of Formula I having isocyanide, amino, carboxylate or phosphate group as a linker, i.e., an isocyanide compound, amine compound, carboxylate compound or phosphate compound:

wherein,

X is NC, $NH_2$, COOH or phosphate, and

Y is a monovalent $C_1$-$C_{30}$ organic group, or a polyvalent $C_1$-$C_{30}$ organic group having at least one substituent group selected from the group consisting of OH, $NH_2$, $NO_2$, methoxy, ethoxy, phenoxy, a halogen atom, hetero sulfur, hetero amine, oxadiazole, triphenylamine, copper phthalocyanine and carbazole, preferably a monovalent or polyvalent $C_1$-$C_{30}$ organic group which is capable of containing in its carbon chain, at least one moiety selected from the group consisting of —CONH—, —COO—, —CO—, —$CH_2$—, —Si—, bis(porphyrin),

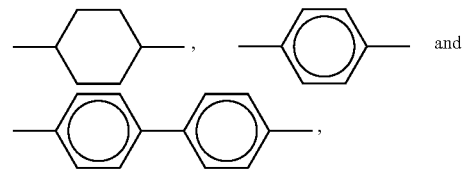

and more preferably, a mono-, di-, tri-, tetra- and penta-valent organic group.

The metal nanoparticle of another exemplary embodiment of the present invention having a structure as shown in FIG. 2 can be prepared, for example, by formation of a self-assembled monolayer (SAM) on the surface of the metal nanoparticle, via a compound of Formula II in which a functional group such as a thiol, isocyanide group or the like is connected to a group containing an alkoxy silyl group.

wherein,

X is SH, NC, $NH_2$, COOH, or phosphate; and

Z is —$(CH_2)_n$—Si(OR)$R_1R_2$ wherein $R_1$ and $R_2$ are independently $CH_3$ or OR, R is a $C_1$-$C_{20}$ alkyl group and n is an integer of from 1 to 10, preferably —$(CH_2)_n$—Si(OR)$_3$ or —$(CH_2)_n$—Si(OR)(CH$_3$)$_2$ wherein R is a $C_1$-$C_{10}$ alkyl group, and n is an integer of from 1 to 6.

The metal nanoparticle that can be used in exemplary embodiments of the present invention is not particularly limited, and may be, for example, a gold, silver, copper, palladium or platinum metal nanoparticle having a particle diameter of 1 to several hundred nm, preferably approximately 1 to 100 nm, and more preferably approximately 1 to 30 nm.

Further, there is no particular limit to the compounds represented by Formula I, and specific examples of compounds (I) that can be used in an example embodiment of the present invention may include: isocyanide compounds which are known to easily form a coordinate bond via a sigma bond with a metal (Langumir, 14, 1684, (1998)), such as butyl isocyanide, tert-butyl isocyanide, 1,1,3,3-tetramethylbutyl isocyanide, 1,6-diisocyanohexane, cyclohexyl isocyanide, cyanomethyl N,N-dimethyldithiocarbamate, 1-cyano-N-methylthioformamide, benzyl cyanide, 2-naphthylacetonitrile, 4-phenylbutyronitrile, 3-anilinopropionitrile, 3-(benzylamino)propionitrile, 2-methylbenzyl cyanide, 2-fluorophenylacetonitrile, 2-chlorobenzyl cyanide, 2-bromophenylacetonitrile, 3-chlorobenzylcyanide, (3-methoxyphenyl)-acetonitrile, 3-phenoxyphenylacetonitrile, 1,3-phenylenediacetonitrile, 4-hydroxybenzyl cyanide, (4-methoxyphenyl)acetonitrile, 4-aminobenzyl cyanide, 4-nitrophenylacetonitrile, 4'-chloro-2-cyanoacetanilide, 4-cyanophenol, 4-biphenylcarbonitrile, 4'-pentyl-4-biphenylcarbonitrile, 4'-hexyl-4-biphenylcarbonitrile, 4'-hydroxy-4-biphenylcarbonitrile and 9-anthracenecarbonitrile; amine compounds such as aniline, 4-ethylaniline, 4-cyclohexylaniline, 2,3-diaminophenol, 3,4-difluoroaniline, 4-aminobiphenyl, 9-aminophenanthrene, 1-aminoindan, 3,5-dimethoxybenzylamine, 3,4,5-trimethoxybenzylamine, 1,9-diaminononane, 1,10-diaminodecane, 1,12-diaminododecane, tetraethylenepentamine and 1-adamantanamine; carboxylate compounds such as octanoic acid, undecanoic acid, undecadioic acid, ethoxyacetic acid, cycloheptane carboxylic acid, 1-adamantaneacetic acid, phenylacetic acid, 6-phenylhexanoic acid, 4-fluorophenylacetic acid, 4-hydroxycinnamic acid, salicylic acid, 4-tert-butylbenzoic acid, 1,3,5-benzenetricarboxylic acid, 2,5-dinitrobenzoic acid, 3,5-di-tert-butylbenzoic acid, gallic acid, 4,4'-biphenyldicarboxylic acid, 1-naphtholic acid, 9-fluorenecarboxylic acid, 1-pyrenecarboxylic acid, carbobenzyloxyglycine and 6-(carbobenzyloxyamino)-caproic acid; and phosphate compounds such as diphenyl phosphite, dibenzyl phosphite, bis(4-nitrobenzyl)phosphate, dimethyl (3-phenoxyacetonyl)phosphate, triphenyl phosphite, benzyl diethyl phosphite, phenyl phosphinic acid, ethyl phenyl phosphate, bis(4-methoxyphenyl) phosphonic acid, dimethyl phenylphosphonite, diethyl phenylphosphonite, diphenyl phosphonic acid, phenyl phosphonic acid, (4-aminobenzyl) phosphonic acid, diphenyl methyl phosphate, 1-naphthyl phosphate and 1,1'-binaphthyl-2,2'-diyl hydrogen phosphate.

Specific examples of the compounds represented by Formula II may include, but are not limited to, N-(3-(trimethoxysilyl)propylethylene diamine, 3-aminopropylmethyldimethoxysilane, mercaptomethylmethyldiethoxysilane, m-aminophenyltrimethoxysilane, 4-aminobutyltriethoxysilane, N-(2-aminoethyl)-3-aminopropylmethyldimethoxysilane, 3-mercaptopropyltrimethoxysilane, 3-mercaptopropylmethyldimethoxysilane, 3-mercaptopropyltriethoxysilane, 4-(triethoxysilyl)butyronitrile and 3-(triethoxysilyl)propylthioisocyanate.

Specifically, the metal nanoparticles according to exemplary embodiments of the present invention can be formed by obtaining a conventional metal nanoparticle using a known method, and dispersing and stirring the thus-obtained metal nanoparticle, in conjunction with a compound of Formula I or II, in a suitable organic solvent for a predetermined time. There is no particular limit to a method for preparing nanoparticles and therefore any method known in the art may be employed in exemplary embodiments of the present invention. For example, metal nanoparticles can be prepared by reducing an aqueous solution containing metal ions to form nanoparticles, with a reducing agent such as citrate, EDTA or $NaBH_4$, in the presence of a surfactant for stabilization of the particles such as sodium oleate if necessary. Alternatively, metal nanoparticles can be prepared by refluxing an aqueous solution of metal hydrazine carboxylate of the target metal $[M(N_2H_3COO)_2.2H_2O$ (M=Mg, Ca, Mn, Fe, Co, Ni or Cu)] at a temperature of approximately 70 to 90° C., preferably approximately 80° C.

In addition to the above-mentioned methods, metal nanoparticles can be prepared by reacting an organic solution of the compound of Formula I or II having a thiol, isocyanide, amino, carboxylate or phosphate group with an aqueous solution containing target metal ions, in the presence of a phase-transfer catalyst, thereby obtaining a dispersion of metal particles surrounded by molecules of the compound of Formula I or II, and treating the dispersion with a reducing agent to thereby precipitate metal nanoparticles containing a self-assembled monolayer, followed by centrifugation to directly obtain metal nanoparticles on which the self-assembled monolayer was formed.

By appropriately controlling the size of nanoparticles via the adjustment of reaction conditions and concentrations of materials to be used during a manufacturing process of metal nanoparticles it is possible to control conductivity of the film or pattern fabricated using the above nanoparticles to within a desired range.

The metal nanoparticles of exemplary embodiments of the present invention having a molecular structure as shown in FIG. 1 or 2 may be used alone, or otherwise may be used in any combination thereof in an appropriate content, depending upon desired applications or purposes.

That is, another example embodiment of the present invention provides a metal nanoparticle composition comprising a metal nanoparticle of FIG. 1 and/or a metal nanoparticle of FIG. 2. Advantageously, the metal nanoparticle composition of an exemplary embodiment of the present invention imparts superior uniformity, packing density, adhesion and conductivity to the film.

Herein, at least one of the metal nanoparticles of FIG. 1 and the metal nanoparticles of FIG. 2 may be optionally selected and mixed in an appropriate amount by those skilled in the art. Upon taking into consideration conductivity and adhesion, the mixing ratio of individual metal nanoparticles may be preferably in the range of 1:1 to 10:1, more preferably 1:1 to 5:1, even though there is no particular limitation to the mixing ratio of nanoparticles.

Further, another exemplary embodiment of the present invention provides a composition for forming a pattern, comprising at least one of metal nanoparticles; an organic solvent; and optionally at least one polymer of the conductive and non-conductive polymers.

The metal nanoparticles used in an exemplary embodiment of the present invention may be at least one of the metal nanoparticles of FIG. 1 and/or FIG. 2, as discussed hereinbefore. The amount of nanoparticles used in the composition may vary depending upon thickness or conductivity of films or patterns to be obtained, viscosity of compositions, and coating methods to be used. Without particular limitation, the content of nanoparticles in the composition may be preferably in the range of approximately 0.01 to 80% by weight, more preferably approximately 0.5 to 50% by weight, and with even greater specificity approximately 1 to 20% by weight, based on the total weight of the composition. If the content of the metal nanoparticle is greater than approximately 80% by weight, non-uniformity of the film may occur upon coating and printing.

The organic solvent that can be used in an exemplary embodiment of the present invention includes all kinds of organic solvents employed in the art to which the present invention pertains. Preferably, upon taking into consideration solubility, dispersibility and ease of film formation, propylene glycol methyl ether acetate (PGMEA), dipropylene glycol methyl ether acetate, ethylene glycol mono ethyl ether, 2-methoxyethanol, dimethylformamide (DMF), 4-hydroxy-4-methyl-2-pentanone (PT), methoxy propyl acetate, ethyl-3-ethoxypropionate, cyclohexanone and the like may be used alone or in any combination thereof, without being limited thereto.

As described hereinbefore, the composition for forming a pattern according to an exemplary embodiment of the present invention may further include at least one polymer of the conductive and non-conductive polymer types as a binder.

Incorporation of the binder into the composition may advantageously impart uniformity and various functionalities to the resulting film.

Specific examples of the conductive polymers that can be used in an exemplary embodiment of the present invention include, but are not limited to, polyacetylene (PA), polythiophene (PT), poly(3-alkyl)thiophene (P3AT), polypyrrole (PPY), polyisothianaphthene (PITN), polyethylene dioxythiophene (PEDOT), polyparaphenylene vinylene (PPV), poly(2,5-dialkoxy)paraphenylene vinylene, polyparaphenylene (PPP), polyparaphenylene sulphide (PPS), polyheptadiene (PHT), poly(3-hexyl)thiophene (P3HT), polyaniline (PANI) and any combination thereof. A number-average molecular weight of the conductive polymer is preferably in the range of approximately 1,000 to 30,000, The conductive polymer is used in an amount of approximately 1 to 15 parts by weight, preferably approximately 3 to 10 parts by weight, based on 100 parts by weight of metal nanoparticles. In this instance, for firmness of the film an epoxy acrylate derivative and a commercially available epoxy compound having a glycidyl ether group may be over-coated.

Specific examples of the non-conductive polymers that can be used in an exemplary embodiment of the present invention may include, but are not limited to polyester, polycarbonate, polyvinyl alcohol, polyvinylbutyral, polyacetal, polyarylate, polyamide, polyamideimide, polyetherimide, polyphenylene ether, polyphenylene sulfide, polyethersulfone, polyether ketone, polyphthalamide, polyether nitrile, polybenzimidazole, polycarbodiimide, polysiloxane, polymethylmethacrylate, polymethacrylamide, nitrite rubber, acrylic rubber, polyethylenetetrafluoride, epoxy resin, phenolic resin, melamine resin, urea resin, polybutene, polypentene, ethylene-propylene copolymer, ethylene-butene-diene copolymer, polybutadiene, polyisoprene, ethylene-propylene-diene copolymer, butyl rubber, polymethylpentene, polystyrene, styrene-butadiene copolymer, hydrogenated styrene-butadiene copolymer, hydrogenated polyisoprene, hydrogenated polybutadiene, and any combination thereof. The number-average molecular weight of the non-conductive polymer is preferably in the range of approximately 3,000 to 30,000 taking into consideration solubility and printability. The non-conductive polymer is used in an amount of approximately 0.1 to 10 parts by weight based on 100 parts by weight of metal nanoparticles.

Further, depending upon printing methods and desired applications of the thin film, the composition for forming a pattern according to an exemplary embodiment of the present invention may further include one or more additives such as a defoaming agent, a viscosity-adjusting agent, a dye, a filler, a flame retardant, a wetting agent, a dispersant, and the like, within the range that such additives are not detrimental to desired objects of exemplary embodiments of the present invention. These additives are materials known in the art, which may be used without particular limitation. These additives may be used in an appropriate amount, depending upon additive performance, film thickness and the intended applications. Preferably, the additives may be used in an amount of approximately 0.01 to 15 parts by weight based on 100 parts by weight of metal nanoparticles.

Thorough uniform printing of the pattern-forming composition according to an exemplary embodiment of the present invention on a substrate, followed by patterning, drying and/or baking under predetermined conditions, it is possible to form a conductive film or pattern by a simple method without additional sputtering, etching or photolithography processes.

Materials for the substrate that can be used in an exemplary embodiment of the present invention are not particularly limited, so long as they are not detrimental to the desired objects of exemplary embodiments of the present invention. For example, a glass substrate, silicon wafer or a plastic substrate may be selected and used depending upon the intended applications. Patterning methods for a coating liquid may include, but are not limited to, common printing processes such as ink jet printing, dip pen printing, imprinting, contact printing, roll printing, and the like. For convenience and uniformity of patterning, the most preferred printing method is ink jet printing or imprinting.

Patterning via the printing method using the composition of an exemplary embodiment of the present invention may be carried out by conventional printing processes without particular limitations. For example, a satisfactory patterning method will be specifically described hereinafter. That is, a coating liquid, in which the concentration and viscosity of metal nanoparticles were adjusted to within a predetermined range using Spectra Head (SE 128) and a solvent such as polyethyleneglycol monomethyl ether acetate or dipropyleneglycol methyl ether acetate, is applied to a substrate on which a polyimide bank (for example, width: 10 to 30 μm, and height: 1 to 2 μm) was prepared, or otherwise is ink-jet printed or is imprinted on a surface of the glass substrate which was subjected to $CF_4$ plasma treatment or surface treatment with a hydrophobic material such as fluorine- or siloxane-based water-repellent material, thereby completing of desired patterning. In this connection, the conductivity of the resulting film or pattern optionally may be controlled by adjusting the concentration of metal nanoparticles.

After formation of the pattern is completed by the printing method using a coating liquid, drying may be carried out at a temperature of approximately 80 to 120° C., and preferably approximately 100° C. for approximately 30 seconds to 5 minutes to remove the remaining solvent, thereby resulting in formation of a conductive film or pattern. After the drying step, baking of the film may be additionally carried out at a temperature of approximately 150 to 400° C. for approximately 1 to 30 minutes, thereby resulting in formation of a conductive film or pattern. Upon drying of the film, organic materials bound to metal nanoparticles are separated therefrom and only metals are left on the substrate, thereby forming a desired pattern.

Films or patterns made of the conductive polymers exhibit conductivity by the transfer of pi (n) electrons of double bonds in the molecular chains of the polymers. Therefore, in order to exert sufficient conductivity, films or patterns have problems with respect to pale green or brown color. However, films or patterns formed using metal nanoparticles of an exemplary embodiment of the present invention advantageously display visible light-transparency while having high conductivity. Therefore, the metal nanoparticles of an example embodiment of the present invention may be commercially used in various applications such as antistatic washable sticky mats, antistatic shoes, conductive polyurethane printer rollers, conductive wheels and industrial rollers, antistatic pressure sensitive adhesive films and electromagnetic interference shielding materials, by blending with conductive or non-conductive polymers if needed.

EXAMPLES

Exemplary embodiments of the present invention will now be described in more detail. These examples are provided only for illustrating the present invention and should not be construed as limiting the scope and spirit of the present invention.

Reparative Example 1

Preparation of Gold Nanoparticles

A solution of 50 mM tetraoctylammonium bromide in 20 ml of toluene was added with 25 ml of hydrogen perculatorate ($HAuCl_4 \cdot H_2O$) solution (40 mM), and then stirred. To the resulting solution (orange color) were added 25 ml of an aqueous solution containing 0.4 g of sodium borohydride ($NaBH_4$), and then was stirred for 2 hours to obtain a dark violet reaction mixture. After standing at room temperature, the reaction mixture was separated into an organic layer and an aqueous layer. The organic layer was washed with 0.1 M sulfuric acid solution, 1 M sodium carbonate solution and water, dried over $MgSO_4$, and was filtered through with a 0.5 μm PTFE syringe filter to obtain gold nano-particles. The particles thus obtained were dispersed in toluene. Transmission Electron Microscopy (TEM) examination of the dispersion shows that the gold nanoparticles have an average particle size of 3 to 8 nm. After centrifugation of the organic dispersion, pure gold nanoparticles were obtained from the supernatant.

Preparative Example 2

Preparation of Silver Nanoparticles

A solution containing 5 g of $AgNO_3$ in 0.1 liter of distilled water was added to 0.3 liter of an ice-bath containing $2 \times 10^{-3}$ M sodium borohydride ($NaBH_4$), and was stirred for 2 hours. The reaction mixture was centrifuged to separate a supernatant and the resulting slurry was dried over. $MgSO_4$, poured into toluene, and was filtered through a 0.5 μm PTFE syringe filter to obtain silver nanoparticles. The particles thus obtained were dispersed in toluene. TEM examination of the dispersion shows that silver nanoparticles have an average size of 4 to 8 nm. After centrifugation of the organic dispersion, pure silver nanoparticles were obtained from the supernatant.

Preparative Example 3

Preparation of Copper Nanoparticles 300 mg of copper hydrazine carboxylate (CHC) prepared from cupric chloride and hydrazine carboxylic acid ($N_2H_3COOH$) were dissolved in 100 ml of distilled water, and were refluxed at 80° C. for 3 hours under a nitrogen atmosphere. A color change of the solution from blue to red represents the presence of metallic copper in the solution. The reaction mixture was centrifuged and pure copper nanoparticles were obtained from the supernatant. The particles thus obtained were dispersed in toluene. TEM examination of the dispersion shows that the copper nanoparticles have an average particle size of 5 to 10 nm.

Preparative Example 4

Preparation of Palladium Nanoparticles

Hydrazine ($N_2H_4$) (40 mM, 10 ml) was added dropwise to a 100 ml yellowish solution of $Na_2PdCl_4$ (5 mM, 15 ml), and the resulting mixture was reacted for 3 hours, to obtain a brown dispersion of palladium nanoparticles, which then underwent centrifuge and separation of pure palladium nanoparticles from the supernatant. The particles thus obtained were dispersed in toluene. TEM examination of the dispersion shows that the palladium nanoparticles have an average particle size of 3 to 10 nm.

Preparative Example 5

Preparation of Platinum Nanoparticles 5 ml of 0.06 M sodium borohydride ($NaBH_4$) and 10 ml of 0.0033 M hydrogen hexachloroplatinate (VI) hexahydrate ($H_2PtCl_6 \cdot 6H_2O$) were mixed with stirring, and were reacted for 2 hours, to obtain a dark brown dispersion. The dispersion thus obtained was allowed to stand so as to separate into an organic layer and an aqueous layer. The separated organic layer was dried over $MgSO_4$ and was filtered through a 0.5 μm PTFE syringe filter. TEM examination shows that platinum nanoparticles having an average particle size of 2 to 5 nm were obtained.

Example 1

Introduction of Organic Group into Surface of Gold Nanoparticles 0.2 g of the gold nanoparticles prepared in Preparative Example 1 was dispersed in 50 ml of 1:1 mixture of concentrated sulfuric acid and 30% hydrogen peroxide, and were slowly stirred for 20 minutes. Then, the dispersion was diluted with 250 ml of distilled water, filtered through a 0.2 μm filter, washed 5 times with 50 ml of methanol and then dried in an oven at 160° C. for 5 hours. 0.1 g of the thus-dried gold nanoparticles was added in combination with 1.3 g of 4-cyanophenol to 200 ml of toluene and the mixture was stirred for 72 hours. The resulting products were filtered through a 0.2 μm filter, washed twice with THF, and were then dried in an oven at 30° C. under reduced pressure, thereby obtaining gold nanoparticles having hydroxyl moieties connected via an isocyanide group on the surface thereof.

Example 2

Introduction of Organic Group into Surface of Silver Nanoparticles

Silver nanoparticles having hydroxyl moieties connected via an isocyanide group on the surface thereof were obtained in the same manner as in Example 1, except that 0.2 g of the silver nanoparticles prepared in Preparative Example 2 was used instead of the gold nanoparticles.

Example 3

Introduction of Organic Group into Surface of Copper Nanoparticles

Copper nanoparticles having hydroxyl moieties connected via an isocyanide group on the surface thereof were obtained in the same manner as in Example 1, except that 0.2 g of the copper nanoparticles prepared in Preparative Example 3 was used, instead of the gold nanoparticles.

Example 4

Introduction of Organic Group into Surface of Palladium Nanoparticles

Palladium nanoparticles having hydroxyl moieties connected via an isocyanide group on the surface thereof were obtained in the same manner as in Example 1, except that 0.2 g of the palladium nanoparticles prepared in Preparative Example 4 was used, instead of the gold nanoparticles.

Example 5

Introduction of Organic Group into Surface of Platinum Nanoparticles

Platinum nanoparticles having hydroxyl moieties connected via an isocyanide group on the surface thereof were obtained in the same manner as in Example 1, except that 0.2 g of the platinum nanoparticles prepared in Preparative Example 5 was used, instead of the gold nanoparticles.

Example 6

Introduction of Alkoxysilyl Group into Surface of Gold Nanoparticles 0.2 g of the gold nanoparticles prepared in Preparative Example 1 was dispersed in 50 ml of 1:1 mixture of concentrated sulfuric acid and 30% hydrogen peroxide, and was slowly stirred for 20 minutes. Then, the dispersion was diluted with 250 ml of distilled water, filtered through a 0.2 µm filter, was washed five times with 50 ml of methanol, and was dried in an oven at 160° C. for 5 hours. 0.1 g of the dried gold nanoparticles in combination with 0.2 g of N-[3-(trimethoxysilyl)propylethylene diamine was added to 200 ml of toluene, and was stirred for 72 hours. The resulting products were filtered through a 0.2 µm filter, washed twice with THF, and dried under a reduced pressure in an oven at 30° C., thereby affording gold nanoparticles having a trimethoxysilyl group introduced into the surface thereof.

Example 7

Formation of Pattern Using Metal Nanoparticles and Measurement of Conductivity

Ink jet compositions 1 through 5 were prepared respectively, which were composed of 0.1 g of respective metal nanoparticles prepared in Examples 1 to 5, and 10 g of propyleneglycol methylether acetate (PGMEA) as a solvent. Each composition was ultra-sonicated for 1 hour to sufficiently mix each component, and then was filtered through a 0.5 µm syringe, followed by the ink-jet printing of the product on a glass substrate which was surface-treated with $CF_4$ plasma. The resulting film was dried at 100° C. for 1 minute to remove the solvent remaining on the printed surface of the substrate. Each conductive film thus formed was baked at a temperature of 250 to 400° C. for 1 minute, thereby obtaining a metal nanoparticle film having a desired pattern thereon. Conductivity of the film was measured by calculating a thickness of the sample, using a Jandel Universal 4-Point Probe Station. The results thus obtained are shown in Table 1 below.

TABLE 1

| Sample | Conductivity (S/cm) × $10^4$ |
| --- | --- |
| Example 1 | 15 |
| Example 2 | 25 |
| Example 3 | 15 |
| Example 4 | 10 |
| Example 5 | 15 |

Example 8

Formation of Pattern Using Metal Nanoparticles and Conductive Polymer, and Measurement of Conductivity Ink jet compositions 6 through 10 were prepared respectively, which were composed of 2 g of respective metal nanoparticles prepared in Examples 1 to 5, 0.5 g of 3% polythiophene (PT) in dimethylformamide (DMF) as a conductive polymer and 100 g of propyleneglycol methylether acetate (PGMEA) as a solvent. Each composition was ultra-sonicated for 1 hour to sufficiently mix each component, and was then filtered through a 0.5 µm syringe, followed by the ink-jet printing of the product on a glass substrate which was surface-treated with $CF_4$ plasma. The resulting film was dried at 100° C. for 1 minute to remove the solvent remaining on the printed surface of the substrate, thereby obtaining a metal nanoparticle film having a desired pattern thereon. Conductivity of the film was measured by calculating a thickness of the sample, using a 4-Point Probe. The results thus obtained are shown in Table 2 below.

TABLE 2

| Sample | Conductivity (S/cm) |
| --- | --- |
| Example 1 + PT | 18 |
| Example 2 + PT | 35 |
| Example 3 + PT | 23 |
| Example 4 + PT | 32 |
| Example 5 + PT | 21 |

Example 9

Formation of Pattern Using Metal Nanoparticles and Non-Conductive Polymer, and Measurement of Conductivity Ink jet compositions 11 through 15 were prepared respectively, which were composed of 5 g of the respective metal nanoparticles prepared in Examples 1 to 5, 0.1 g of polystyrene (PS) (MW=5,000) as a non-conductive polymer, and 50 g of propyleneglycol methylether acetate (PGMEA) and 50 g of dipropyleneglycol methylether acetate as solvent. Each composition was ultra-sonicated for 1 hour to sufficiently mix each component, and then was filtered through a 0.5 µm syringe, followed by the ink-jet printing of the product on a glass substrate which was surface-treated with $CF_4$ plasma. The resulting film was dried at 100° C. for 1 minute to remove the solvent remaining on the printed surface of the substrate, thereby obtaining a metal nanoparticle film having a desired pattern thereon. Conductivity of the film was measured by calculating a thickness of the sample, using a 4-Point Probe. The results thus obtained are shown in Table 3 below.

TABLE 3

| Sample | Conductivity (S/cm) |
| --- | --- |
| Example 1 + PT | 17 |
| Example 2 + PT | 21 |
| Example 3 + PT | 15 |
| Example 4 + PT | 21 |
| Example 5 + PT | 27 |

Example 10

Formation of Pattern Using Two Kinds of Metal Nanoparticles, and Measurement of Conductivity Ink jet compositions 16 through 20 were prepared respectively, which were composed of 3 g of the respective metal nanoparticles prepared in Examples 1 to 5, 1 g of metal nanoparticles prepared in Example 6, and 50 g of propyleneglycol methylether acetate (PGMEA) and 50 g of dipropyleneglycol methylether acetate as solvent. Each composition was ultra-sonicated for 1 hour to sufficiently mix each component, and then was-filtered through a 0.5 μm syringe, followed by ink-jet printing of the product on a glass substrate which was surface-treated with $CF_4$ plasma. The resulting film was dried at 100° C. for 1 minute to remove the solvent remaining on the printed surface of the substrate. The resulting conductive film was baked at a temperature of 250 to 400° C. for 1 min, thereby obtaining a metal nanoparticle film having a desired pattern thereon. Conductivity of the film was measured by calculating a thickness of the sample, using a 4-Point Probe. The results thus obtained are shown in Table 4 below.

TABLE 4

| Sample | Conductivity (S/cm) $\times 10^4$ |
| --- | --- |
| Example 1 + Example 6 | 23 |
| Example 2 + Example 6 | 31 |
| Example 3 + Example 6 | 33 |
| Example 4 + Example 6 | 24 |
| Example 5 + Example 6 | 43 |

As can be seen from results of Tables 1 through 4, the use of the metal nanoparticles of exemplary embodiments of the present invention can result in the formation of a high-conductivity pattern even without additional etching, photolithography processes and the like. In addition, it can be seen that the use of the metal nanoparticles of exemplary embodiments of the present invention in admixture with a conductive polymer or non-conductive polymer enables the formation of a film having relatively high conductivity. In particular, upon the combined use of the metal nanoparticles having an alkoxy silyl group introduced thereinto, it is possible to afford a pattern having superior conductivity.

As is apparent from the above description, the metal nanoparticles of exemplary embodiments of the present invention can be easily formed into a conductive film or pattern by a printing method, and the resulting film or pattern significantly exhibits excellent conductivity which may also be optionally adjusted if desired. Therefore, the metal nanoparticles of exemplary embodiments of the present invention can be used in the fields such as antistatic washable sticky mats, antistatic shoes, conductive polyurethane printer rollers, electromagnetic interference shielding materials, etc.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A metal nanoparticle having a self-assembled monolayer of a compound represented by Formula I formed on the surface thereof:

$$X-Y \quad\quad\quad (I)$$

wherein,

X is $NH_2$, COOH or phosphate,

Y is a monovalent $C_1$-$C_{30}$ organic group, or a polyvalent $C_1$-$C_{30}$ organic group having one or more substituent groups, each substituent selected from the group consisting of OH, $NH_2$, $NO_2$, ethoxy, phenoxy, a halogen atom, hetero sulfur, hetero amine, oxadiazole, triphenylamine, copper phthalocyanine and carbazole, and the compound of Formula I is not aniline ($C_6H_5NH_2$).

2. The nanoparticle of claim 1, wherein X is COOH in the compound represented by Formula 1.

3. The nanoparticle of claim 1, wherein X is phosphate in the compound represented by Formula 1.

4. The nanoparticle according to claim 1, wherein the compound of Formula I is selected from the group consisting of carboxylate-based compounds, phosphate-based compounds, and amine-based compounds other than aniline.

5. The nanoparticle of claim 4, wherein the carboxylate-based compounds include one of octanoic acid, undecanoic acid, undecadioic acid, ethoxyacetic acid, cycloheptane carboxylic acid, 1-adamantaneacetic acid, phenylacetic acid, 6-phenylhexanoic acid, 4-fluorophenylacetic acid, 4-hydroxycinnamic acid, salicylic acid, 4-tert-butylbenzoic acid, 1,3,5-benzenetricarboxylic acid, 2,5-dinitrobenzoic acid, 3,5-di-tert-butylbenzoic acid, gallic acid, 4,4'-biphenyldicarboxylic acid, 1-naphtholic acid, 9-fluorenecarboxylic acid, 1-pyrenecarboxylic acid, carbobenzyloxyglycine and 6-(carbobenzyloxyamino)-caproic acid;

the phosphate-based compounds include one of diphenyl phosphite, dibenzyl phosphite, bis(4-nitrobenzyl)phosphate, dimethyl(3-phenoxyacetonyl)phosphate, triphenyl phosphite, benzyl diethyl phosphite, phenyl phosphinic acid, ethyl phenyl phosphate, bis(4-methoxyphenyl)phosphonic acid, dimethyl phenylphosphonite, diethyl phenylphosphonite, diphenyl phosphonic acid, phenyl phosphonic acid, (4-aminobenzyl)phosphonic acid, diphenyl methyl phosphate, 1-naphthyl phosphate and 1,1'-binaphthyl-2,2'-diylhydrogenphosphate; and the amine-based compounds include one of 4-ethylaniline, 4-cyclohexylaniline, 2,3-diaminophenol, 3,4-difluoroaniline, 4-aminobiphenyl, 9-aminophenanthrene, 1-aminoindan, 3,5-dimethoxybenzylamine, 3,4,5-trimethoxybenzylamine, 1,9-diaminononane, 1,10-diaminodecane, 1,12-diaminododecane, tetraethylenepentamine and 1-adamantanamine.

6. A composition comprising:

a plurality of the metal nanoparticles having a self-assembled monolayer of claim 1, and additional metal nanoparticles having a self-assembled monolayer of a compound represented by Formula II formed on the surface thereof:

$$X-Z \quad\quad\quad (II)$$

wherein,

X is SH, NC, $NH_2$COOH, or phosphate; and

Z is —$(CH_2)_n$—$Si(OR)R_1R_2$, wherein $R_1$ and $R_2$ are independently $CH_3$ or OR, R is a $C_1$-$C_{20}$ alkyl group, and n is an integer of from 1 to 10.

7. The composition according to claim 6, wherein the plurality of metal nanoparticles of claim 1 and the additional metal nanoparticles are included in a ratio of 1:1 to 10:1.

8. A composition for forming a pattern, comprising at least one material selected from the group consisting of metal nanoparticles of claim 1 and metal nanoparticles having a self-assembled monolayer of a compound represented by Formula II formed on the surface thereof; and an organic solvent:

$$X-Z \quad (II)$$

wherein,

X is SH, NC, $NH_2COOH$, or phosphate; and z is —$(CH_2)_n$—$Si(OR)R_1R_2$, wherein $R_1$ and $R_2$ are independently $CH_3$ or OR, R is a $C_1$-$C_{20}$ alkyl group, and n is an integer of from 1 to 10.

9. The composition according to claim 8, wherein the content of metal nanoparticles in the composition is in the range of approximately 0.01 to 80% by weight.

10. The composition according to claim 8, wherein the composition further includes at least one polymer of conductive and non-conductive polymer types.

11. The composition according to claim 10, wherein the conductive polymer is selected from the group consisting of polyacetylene (PA), polythiophene (PT), poly(3-alkyl) thiophene (P3AT), polypyrrole (PPY), polyisothianaphthene (PITN), polyethylene dioxythiophene (PEDOT), polyparaphenylene vinylene (PPV), poly(2,5-dialkoxy)paraphenylene vinylene, polyparaphenylene (PPP), polyparaphenylene sulphide (PPS), polyheptadiene (PHT), poly(3-hexyl) thiophene (P3HT), polyaniline (PANI) and any combination thereof, and is included in an amount of approximately 1 to 15 parts by weight, based on 100 parts by weight of metal nanoparticles.

12. The composition according to claim 10, wherein the non-conductive polymers is selected from the group consisting of polyester, polycarbonate, polyvinyl alcohol, polyvinylbutyral, polyacetal, polyarylate, polyamide, polyamideimide, polyetherimide, polyphenylene ether, polyphenylene sulfide, polyethersulfone, polyether ketone, polyphthalamide, polyether nitrile, polybenzimidazole, polycarbodiimide, polysiloxane, polymethylmethacrylate, polymethacrylamide, nitrile rubber, acrylic rubber, polyethylenetetrafluoride, epoxy resin, phenolic resin, melamine resin, urea resin, polybutene, polypentene, ethylene-propylene copolymer, ethylene-butene-diene copolymer, polybutadiene, polyisoprene, ethylene-propylene-diene copolymer, butyl rubber, polymethylpentene, polystyrene, styrene-butadiene copolymer, hydrogenated styrene-butadiene copolymer, hydrogenated polyisoprene, hydrogenated polybutadiene and any combination thereof, and is included in an amount of approximately 0.1 to 10 parts by weight based on 100 parts by weight of metal nanoparticles.

13. A method for forming a conductive pattern, comprising printing the composition of claim 8 on a substrate, followed by patterning; and drying the resulting film.

14. The method according to claim 13, wherein the printing is carried out by ink jet printing, dip pen printing, imprinting, contact printing or roll printing.

15. The method according to claim 13, wherein the method further includes a baking step after the drying step.

16. The method according to claim 15, wherein the baking step is carried out at a temperature of approximately 150 to 400° C. for approximately 1 to 30 minutes.

17. A metal nanoparticle having a self-assembled monolayer of a compound represented by Formula I formed on the surface thereof:

$$X—Y \quad (I)$$

wherein,

X is $NH_2$, COOH or phosphate, is a monovalent or polyvalent $C_1$-$C_{30}$ organic group having one or more substituent groups, each substituent selected from the group consisting of OH, $NH_2$, $NO_2$, methoxy, ethoxy, phenoxy, a halogen atom, hetero sulfur, hetero amine, oxadiazole, triphenylamine, copper phthalocyanine and carbazole, Y is capable of containing at least one moiety selected from the group consisting of —CONH—, —COO—, —CO—, —$CH_2$—,

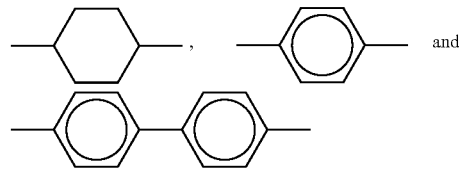

in its carbon chain, and the metal nanoparticle is a gold, silver, copper, palladium or platinum metal nanoparticle having a particle diameter of 1 to several hundred nm.

* * * * *